United States Patent
Shudarek

(10) Patent No.: US 7,535,125 B2
(45) Date of Patent: *May 19, 2009

(54) SINGLE-PHASE FILTER FOR REDUCING HARMONICS

(75) Inventor: Todd A. Shudarek, West Bend, WI (US)

(73) Assignee: MTE Corporation, Menomonee Falls, WI (US)

( * ) Notice: Subject to any disclaimer, the term of this patent is extended or adjusted under 35 U.S.C. 154(b) by 12 days.

This patent is subject to a terminal disclaimer.

(21) Appl. No.: 11/430,778

(22) Filed: May 9, 2006

(65) Prior Publication Data

US 2007/0263335 A1    Nov. 15, 2007

(51) Int. Cl.
*H02J 1/02* (2006.01)
*H02M 1/12* (2006.01)
*H02M 1/14* (2006.01)

(52) U.S. Cl. .................................................. 307/105
(58) Field of Classification Search ................ 307/105, 307/104; 333/177
See application file for complete search history.

(56) References Cited

U.S. PATENT DOCUMENTS

| | | | |
|---|---|---|---|
| 1,953,233 A | 4/1934 | Jonas | |
| 3,379,961 A | 4/1968 | Kobayashi et al. | |
| 3,440,516 A | 4/1969 | Kaiser | |
| 3,535,542 A | 10/1970 | Gilsig | |
| 3,584,290 A * | 6/1971 | Spreadbury | 323/308 |
| 4,677,401 A | 6/1987 | Nonaka et al. | |
| 4,697,126 A | 9/1987 | Jarvinen et al. | |
| 4,710,735 A | 12/1987 | Blahous et al. | |
| 4,967,097 A | 10/1990 | Mehl | |
| 5,434,455 A | 7/1995 | Kammeter | |
| 5,499,178 A | 3/1996 | Mohan | |
| 5,619,080 A | 4/1997 | Pennington et al. | |
| 5,982,645 A | 11/1999 | Levran et al. | |
| 6,011,705 A | 1/2000 | Duca et al. | |
| 6,127,743 A | 10/2000 | Levin et al. | |
| 6,339,265 B1 | 1/2002 | Levin et al. | |
| 6,549,434 B2 | 4/2003 | Zhou et al. | |
| 6,605,882 B2 | 8/2003 | Boudrias et al. | |
| 6,844,794 B2 | 1/2005 | Lauri | |
| 7,242,269 B2 * | 7/2007 | Perreault et al. | 333/177 |

(Continued)

OTHER PUBLICATIONS

TCI HG7 HarmonicGuard Series Drive-Applied Filter: Performance and Protection for Drives Manual; Rev. May 15, 2005; Publication No. 25220.

(Continued)

*Primary Examiner*—Stephen W Jackson
*Assistant Examiner*—Carlos Amaya
(74) *Attorney, Agent, or Firm*—Greenberg Traurig, LLP

(57) ABSTRACT

A harmonic current filter includes a first and second power system connectors and first and second load connectors, wherein the second power system connector is directly connected to the second load connector. The filter has a magnetically permeable core with three legs. A first line winding is connected between the first power system connector and the first load connector and is wound around one leg in a manner to produce magnetic flux having a given polarity. A capacitor and a first shunt winding are connected in series between the first power system connector and the second load connector. The first shunt winding is wound around another leg in a manner to produce magnetic flux having an opposite polarity.

15 Claims, 2 Drawing Sheets

U.S. PATENT DOCUMENTS

| | | | |
|---|---|---|---|
| 7,378,754 B2 * | 5/2008 | Shudarek | 307/13 |
| 2002/0105816 A1 | 8/2002 | Boudrias et al. | |
| 2003/0160515 A1 | 8/2003 | Yu et al. | |
| 2004/0183377 A1 | 9/2004 | Levin et al. | |
| 2004/0240237 A1 | 12/2004 | Okayama et al. | |
| 2005/0063202 A1 | 3/2005 | Stancu et al. | |

OTHER PUBLICATIONS

Broad-Band Harmonic Filter brochure, GE Industrial Systems; DEA-263 (5M Nov. 1999); Copyright 1999.

Magnetic Specialties; 319L123 PH Harmonic Trap Filter Reactor—MS4700 brochure.

Broad-Band Harmonic Filter brochure.

HG Reliable Harmonic Filtration Technology with the HarmonicGuard Series Drive-Applied Filter brochure.

Energy Alliance Low Voltage Harmonic Filter brochure.

Harmonic HG7 Filter tables.

LV Capacitors for Switchboards: Advance Filter Reactors; ABB Limited; EJ 156/1E Sep. 2001.

Harmonic Filter Reactor Manufacturer Exporting Direct from Turkey; Copyright Notice 1999-2008 Alibaba.com; http://www.alibaba.com/catalog/11124113/Harmonic_Filter_Reactor.html.

Filterkreisdrossel COL: Harmonic Circuit Filter Reactor COL Range; Block; www.block-trafo..eu__fileadmin__productpdf_COL.pdf.

Iron-Core Harmonic Filter Reactors; Northeast Power Systems, Inc.; http://www.nepsi.com/ironcorereactors.htm.

Table 2—Core Material Considerations; Magnetic Cores for SMPS; Magnetics, Butler, PA; www.mag-inc.com/pdf/ps-01.pdf.

Magnetically "Soft" Core Materials: Silicon Steel—laminations or tape wound; Electronic Transformers and Inductor Core Types; www.butlerwinding.com/core-types/index.html.

Transformer Design Trade-Offs; Transformer & Inductor Design Handbook; Colonel WM, T. McLyman 2004; ISBN: 0-8247-5393-3.

* cited by examiner

SINGLE-PHASE FILTER FOR REDUCING HARMONICS

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of the Invention

The present invention relates to electrical power distribution systems and more particularly to filters for mitigating harmonics currents in such systems.

2. Description of the Related Art

Electrical distribution systems, for example in a building or industrial facility, supply electricity to non-linear loads, such as adjustable speed motor drives, uninterruptible power supplies (UPS), battery chargers, servo drives, and welders. These loads produce various levels of current at harmonic frequencies in the power distribution system with the harmonic spectrum depending upon the nature of the load.

the harmonic currents create many problems in the power distribution system, including increased voltage total harmonic distortion level, reduced power distribution equipment reliability, reduced electromagnetic compatibility of the loads, increased power losses, reduced power factor, and other problems which are well known to those skilled in the art.

Many types of apparatus have been devised for mitigating harmonic currents. Such apparatus include power factor corrected power supplies, active filters which inject harmonic currents having a polarity opposite to that generated by the load, resonant L-C filters, AC chokes, and phase shifting systems. As is well known, power factor corrected power supplies are expensive and have a limited application; active filters have a high cost, poor reliability and poor dynamic characteristics and may not be practical with certain loads; resonant L-C filters have a high cost, poor effectiveness in low voltage systems and the tendency to cause the system to operate with a leading power factor; AC chokes have a high voltage drop across the reactors; and phase shifting systems are typically limited in the number of harmonic orders which can be mitigated and the degree of harmonic mitigation depends upon the extent to which harmonics produced by the various harmonic sources are identical and their phase shift angles.

SUMMARY OF THE INVENTION

A single-phase filter for mitigating harmonic currents produced in a power distribution system has a power system connector for connection to a source of electrical power, a load connector for connection to a load powered by the source, and a node for connection to both the source and the load. The filter also has a magnetic core made of a magnetically permeable material.

A first line winding has a first end directly connected to the power system connector and is wound around the magnetic core in an orientation that produces magnetic flux having a first polarity. The second end of the first line winding is coupled to the load terminal. A first shunt winding is wound around the magnetic core in an orientation that produces magnetic flux having a second polarity opposite to the first polarity. A capacitor is connected in series with the first shunt winding between the power system connector and the node.

In a preferred embodiment of the single-phase filter, the magnetic core includes first and second core bridges spaced apart from each other. Three legs extend between the two core bridges, wherein the first line winding and the first shunt winding are wound different legs.

Another embodiment of the single-phase filter includes a second line winding in series with the first line winding and wound around the same leg of the magnetic core as the first shunt winding. A further embodiment of the single-phase filter has a second shunt winding in series with the first shunt winding and wound around the same leg of the magnetic core as the first line winding.

DETAILED DESCRIPTION OF THE INVENTION

Figure 1:
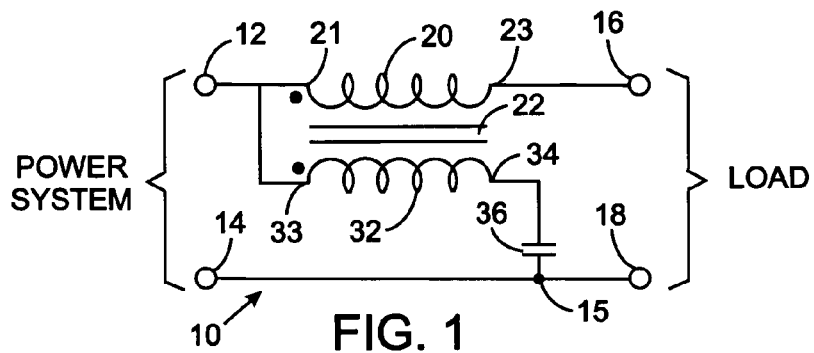
FIG. 1 is a schematic diagram of a first embodiment of a single-phase harmonic mitigating filter.

With initial reference to FIG. 1, a single-phase filter 10 for mitigating harmonic currents has first and second power system connectors 12 and 14 to which the supply lines from an electrical utility or a control circuit for a load are connected. The filter also has first and second load connectors 16 and 18 wherein the second load connector 18 is directly connected to the second power system connector 14 via a node 15. Because the second power system connector 14 and the second load connector 18 directly connected together a single connection point or terminal may used. The term "directly connected" as used herein means that the associated components are connected together by a conductor without any intervening element, such as a resistor, capacitor, or inductor, which affects the transmission of current beyond the effects inherent in any electrical conductor. The power source connectors and the load connectors may be terminals to which wires can be attached or they simply may be electrical leads extending from respective components of the filter that will be described.

Figure 2:
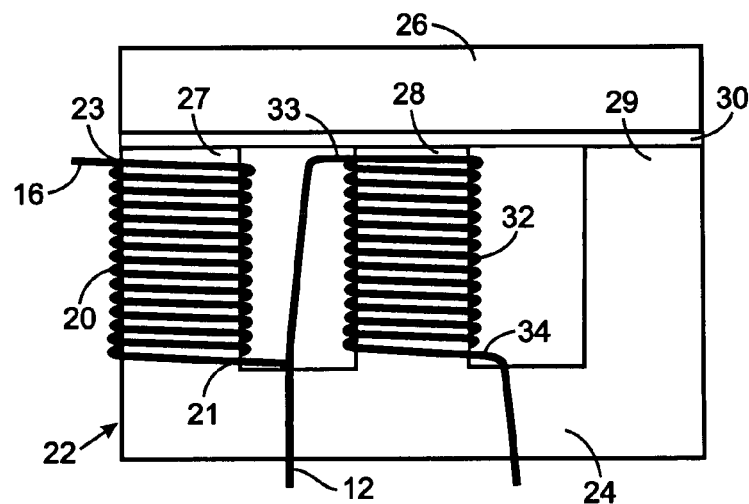
FIG. 2 illustrates one manner in which the coils in FIG. 1 are wound around a core.

With additional reference to FIG. 2, a line winding 20 is wound around a core 22 of magnetically permeable material. The line winding 20 is wound in an orientation wherein the magnetic flux produced by that winding has an instantaneous first polarity as designated by the dot at a first end 21 of the winding, as shown in FIG. 1. The first end 21 of the line winding 20 is directly connected to the first power system connector 12 and a second end 23 is directly connected to the first load connector 16.

The magnetic core 22 has a first core bridge 24 and a second core bridge 26 with three legs 27, 28, and 29 extending between the two bridges. The three legs 27-29 are contiguous with the first core bridge 24 forming a conventional "E" core segment. The second core bridge 26 is spaced from one end of each of the three legs 27-29 by a magnetic insulator 30, thereby forming a gap between each leg and the second core bridge. Alternatively there could be another gap between each leg and the first core bridge 24. The three legs 27-29 and the first and second core bridges 24 and 26 are formed by a series of abutting laminations, as is well known for magnetic cores.

A shunt winding 32 is wound around another leg of the core 22, i.e. the second leg 28 in the embodiment of FIG. 2. The shunt winding 32 is wound in an orientation wherein the magnetic flux produced by that winding has an instantaneous second polarity that is opposite to the first polarity of the flux from the line winding 20, as designated by the dot at a third end 21 of the shunt winding 32 in FIG. 1. The third end 33 of the first shunt winding 32 is directly connected to the first end 21 of the line winding 20, both of which ends are both connected to the first power system connector 12.

With reference again to FIG. 1, the fourth end 34 of the shunt winding 32 is coupled to the second power system connector 14 and the second load connector 18 by a capacitor 36. The capacitor 36 may be a bank of conventional capacitors as necessary to provide the total amount of capacitance for mitigating the harmonic currents. That capacitance, along with the number of turns in each of the line winding and the shunt line winding are provided to tune the filter, using well known methods, to filter the particular harmonic frequencies produced by the load to which the filter 10 is connected.

The harmonic flux generated in the core 22 by the line winding is opposite in direction to that produced in the shunt winding, thereby resulting in at least partial cancellation of the harmonic fluxes. The magnetically coupled line and shunt windings provide a low reactance path shunt path for harmonics generated by the load. Stray fields are reduced as a result of a third leg of the core, leg 29 in FIG. 2, which does not have a winding there around. This provides a flux return path for the two coils.

Figure 3:
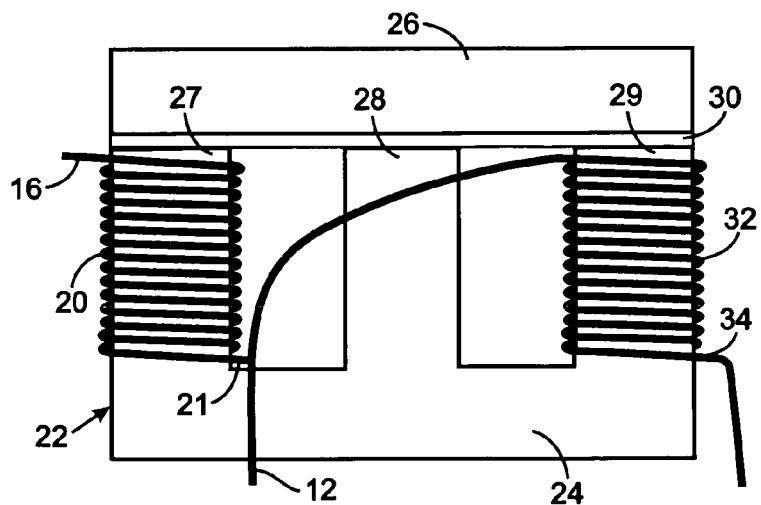
FIG. 3 depicts another manner in which the coils in FIG. 1 are wound around a core.

The magnetic coupling between the line winding 20 and the shunt winding 32 is primarily determined by the geometry of the core 22. The magnetic coupling in interaction between the two coils can be further adjusted by placing the two windings around the outer legs 27 and 29 of the core, as shown in FIG. 3, as opposed to adjacent legs, as shown in FIG. 2. With respect to FIG. 3, the line winding 20 is maintained on the first leg 27, while the shunt winding 32 is located on the third leg 29 with the center, or second, leg 28 not having a winding thereon. In a further alternative that is a variation of the configuration in FIG. 2, the shunt winding 32 may be around the outer first leg 27 with the line winding 20 on the middle second leg 28.

Figure 4:
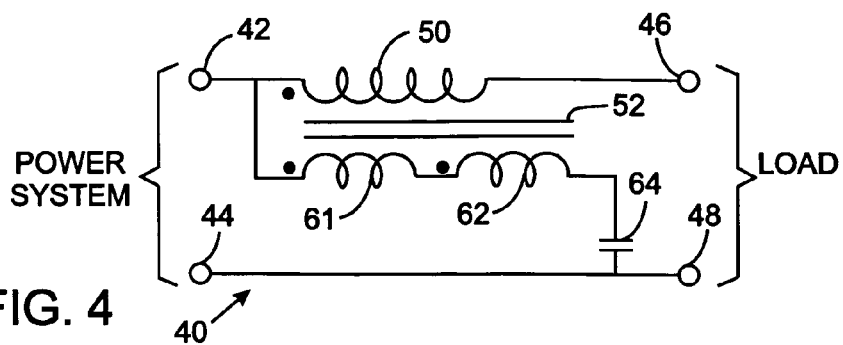
FIG. 4 is a schematic diagram of a second embodiment of a single-phase harmonic mitigating filter having two shunt coils.

With reference to FIG. 4, a second embodiment of a harmonic mitigating filter 40, also has a pair of power system connectors 42 and 44, and a pair of load connectors 46 and 48. A line winding 50 is connected between the first power system connector 42 and the first load connector 46. With additional reference to FIG. 5, the line winding 50 is wound around a core 52, which has the same structure as core 22 described with the previous embodiment. In the illustrated version of the second single-phase filter 40, the line winding 50 is wound around the center second leg 55 with the first and third legs 54 and 56 on opposite sides thereof. First and second core bridges 57 and 58, respectively, extend across the three legs 55-56 with the second core bridge being separated from those legs by a magnetic insulator 59.

The second single phase filter 40 has first and second shunt windings 61 and 62 in series with remote end of the first shunt winding directly connected to the first power system connector 42 and a remote end of the second shunt winding being coupled to the second power system connector 74 by a capacitor 64. The first shunt winding 61 is located on the second leg 55 of the core 52 and is wound in the same direction as the line winding 50, thereby producing a magnetic flux of opposite polarity to magnetic flux from the line winding. The second shunt winding 62 is wound on the first leg 54, but could be on the third leg 56, and is wound to produce magnetic flux having opposite polarity to that produced by the first line winding and having the same polarity as that produced by the first shunt winding 61.

Figure 5:
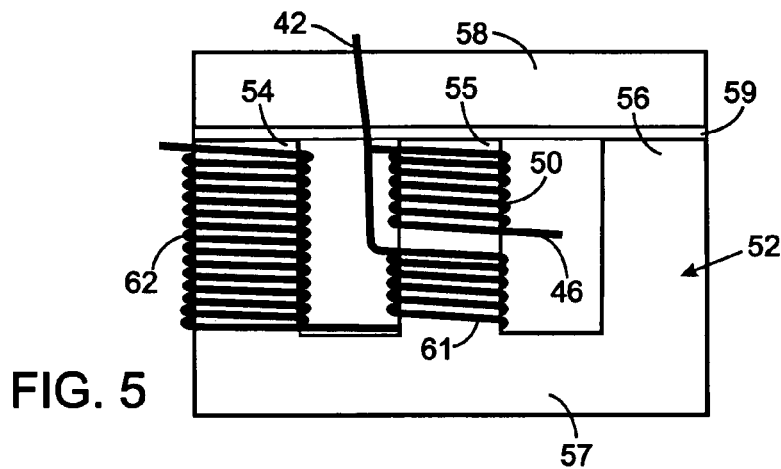
FIG. 5 illustrates a manner in which the coils in FIG. 4 are wound around a core.

The orientation of the different windings could be reversed, such that the line winding 50 and the first shunt winding 61 are on the first leg 54 with the second shunt winding 62 on the center second leg 55. Similarly, although FIG. 5 illustrates the windings on adjacent legs of the core 52, they could be on the first and third legs 54 and 56 with the second leg 55 not having a winding thereon.

Figure 6:
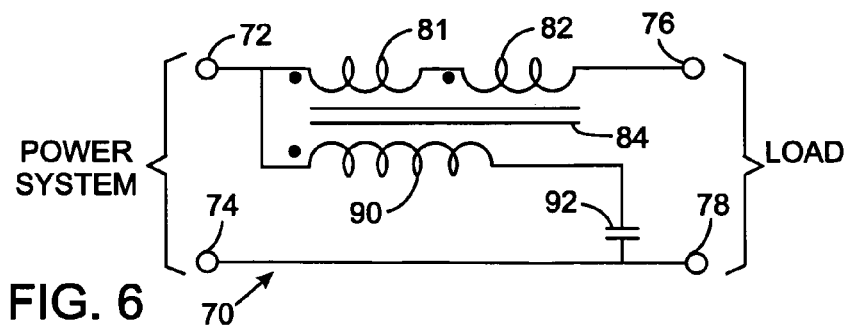
FIG. 6 is a schematic diagram of a third embodiment of a single-phase harmonic mitigating filter having two line coils.
Figure 7:
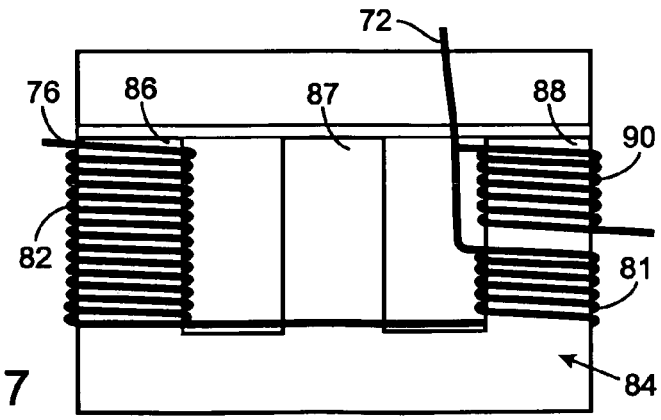
FIG. 7 illustrates a manner in which the coils in FIG. 6 are wound around a core.

FIGS. 6 and 7 depict a third single-phase filter 70 for harmonic currents. First and second line windings 81 and 82 are connected in series between a first power system connector 72 and a first load connector 76. Those line windings 81 and 82 are wound on different legs 86 and 88 of a core 84 in orientations so that the magnetic fluxes produced by each winding have the same polarity. Another core leg 87 is between the two legs 86 and 88. However, the line windings could be wound on adjacent core legs. A shunt winding 90 has one end connected to the first power system connector 72 and second end coupled by a capacitor 92 to both the second power system connector 74 and the second load connector 78. The shunt winding 90 is wound on the same leg 88 of the magnetic core 84 along with the first line winding 81. However, the shunt winding 90 is oriented to produce a magnetic flux in the core in a second polarity in opposition to the polarity of the flux produced by the first line winding 81.

The foregoing description was primarily directed to a preferred embodiment of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

The invention claimed is:

1. A single-phase filter, comprising:
a power system connector for connection to a source of electrical power;
a load connector for connection to a load powered by the source of electrical power;
a core of a magnetically permeable material;
a first line winding having a first end directly connected to the power system connector and a second end coupled to the load connector, the first line winding wound around the core in an orientation that produces magnetic flux having a first polarity;
a first shunt winding wound around the core in an orientation that produces magnetic flux having a second polarity opposite to the first polarity; and
a capacitor connected in series between the first shunt winding and an essentially electrically common point at which both the source of electrical power and the load meet;
wherein the core comprises: a first core bridge; a second core bridge spaced apart from the first core bridge; and three legs extending between the first core bridge and the second core bridge, wherein the first line winding is wound around one of the legs and the first shunt winding is wound around another one of the legs.

2. The single-phase filter as recited in claim 1 wherein the second end of the first line winding is directly coupled to the load terminal.

3. The single-phase filter as recited in claim 1 wherein a first end of the first shunt winding is directly connected to the power system connector.

4. The single-phase filter as recited in claim 1 wherein the core further comprises a gap between the second core bridge and each of the three legs.

5. The single-phase filter as recited in claim 1 further comprising a second shunt winding having a first end connected to a second end of the first shunt winding, the second shunt winding being in series with the capacitor, and the second shunt winding being wound around the core in an orientation that produces magnetic flux having the second polarity.

6. The single-phase filter as recited in claim 5:
wherein the first line winding and the first shunt winding are wound around one of the legs and the second shunt winding is wound around another one of the legs.

7. The single-phase filter as recited in claim 1 further comprising a second line winding having a first end connected to the second end of the first line winding and a second end connected to the load connector, the second line winding being wound around the core in an orientation that produces magnetic flux having the first polarity.

8. The single-phase filter as recited in claim 7:
wherein the first line winding and the first shunt winding are wound around one of the legs and the second line winding is wound around another one of the legs.

9. A single-phase filter, comprising:
a first power system connector and a second power system connector;
a first load connector, and a second load connector directly connected to the second power system connector;
a core of a magnetically permeable material, the core comprising a first core bridge, a second core bridge spaced from the first core bridge, and three legs extending between the first core bridge and the second core bridge;
a first line winding having a first end directly connected to the first power system connector and a second end coupled to the first load connector, the first line winding being wound around one of the legs of the core in an orientation that produces magnetic flux having a first polarity;
a first shunt winding having a first end that is directly connected to the first power system connector, the first shunt winding being wound around another one of the legs of the core in an orientation that produces magnetic flux having a second polarity opposite to the first polarity; and
a capacitor coupled between a second end of the first shunt winding and the second power system connector.

10. The single-phase filter as recited in claim 9 wherein the core further comprises a gap between the second core bridge and each of the three legs.

11. The single-phase filter as recited in claim 9 wherein the first line winding and the first shunt winding are wound around adjacent legs of the core.

12. The single-phase filter as recited in claim 9 wherein one of the three legs of the core is located between the legs on which the first line winding and the first shunt winding are wound.

13. The single-phase filter as recited in claim 9 wherein the second end of the first line winding is directly coupled to the first load terminal.

14. The single-phase filter as recited in claim 9 further comprising a second shunt winding having a first end connected to a second end of the first shunt winding, the second shunt winding being in series with the capacitor, the second shunt winding being wound around the core in an orientation that produces magnetic flux having the second polarity.

15. The single-phase filter as recited in claim 9 further comprising a second line winding having a first end connected to the second end of the first line winding and a second end connected to the first load connector, the second line winding being wound around the core in an orientation that produces magnetic flux having the first polarity.

* * * * *